(12) United States Patent
Fan et al.

(10) Patent No.: US 10,388,602 B2
(45) Date of Patent: Aug. 20, 2019

(54) LOCAL INTERCONNECT STRUCTURE INCLUDING NON-ERODED CONTACT VIA TRENCHES

(71) Applicants: International Business Machines Corporation, Armonk, NY (US); GlobalFoundries, Inc., Grand Cayman (KY)

(72) Inventors: Su Chen Fan, Cohoes, NY (US); Vimal Kamineni, Mechanicville, NY (US); Andre P. Labonte, Mechanicville, NY (US); Ruilong Xie, Niskayuna, NY (US)

(73) Assignees: INTERNATIONAL BUSINESS MACHINES CORPORATION, Armonk, NY (US); GLOBALFOUNDRIES INC. (KY)

( * ) Notice: Subject to any disclaimer, the term of this patent is extended or adjusted under 35 U.S.C. 154(b) by 0 days.

(21) Appl. No.: 15/251,804

(22) Filed: Aug. 30, 2016

(65) Prior Publication Data

US 2017/0170118 A1    Jun. 15, 2017

Related U.S. Application Data

(63) Continuation of application No. 14/964,786, filed on Dec. 10, 2015, now Pat. No. 9,570,397.

(51) Int. Cl.
*H01L 21/768* (2006.01)
*H01L 23/528* (2006.01)
(Continued)

(52) U.S. Cl.
CPC .... *H01L 23/5283* (2013.01); *H01L 21/76805* (2013.01); *H01L 21/76808* (2013.01);
(Continued)

(58) Field of Classification Search
CPC .............. H01L 23/5283; H01L 21/76805
See application file for complete search history.

(56) References Cited

U.S. PATENT DOCUMENTS

| 2002/0008323 A1* | 1/2002 | Watanabe | ......... H01L 21/76807 |
| | | | 257/758 |
| 2013/0307032 A1* | 11/2013 | Kamineni | ............. H01L 23/485 |
| | | | 257/288 |

(Continued)

OTHER PUBLICATIONS

Fan, et al., "Local Interconnect Structure Including Non-Eroded Contact via Trenches", U.S. Appl. No. 15/251,804, filed Aug. 30, 2016.

(Continued)

*Primary Examiner* — Farun Lu
(74) *Attorney, Agent, or Firm* — Cantor Colburn LLP; Vazken Alexanian

(57) ABSTRACT

A local interconnect structure includes a substrate having a dielectric layer and at least one semiconductor contact structure embedded in the dielectric layer. An electrically conductive material is deposited in a non-eroded contact trench that defines at least one electrically conducive contact via. The contact via extends from a first end that is flush with an upper surface of the dielectric layer to a second end that contacts the at one semiconductor contact structure. A local conductive material layer is formed in the dielectric layer and contacts the first end of the contact via. The non-eroded contact trench includes sharp upper corners formed at approximately ninety degrees with respect to the first end of the contact via.

13 Claims, 15 Drawing Sheets

(51) Int. Cl.
*H01L 23/532* (2006.01)
*H01L 23/535* (2006.01)

(52) U.S. Cl.
CPC .. *H01L 21/76816* (2013.01); *H01L 21/76879* (2013.01); *H01L 21/76895* (2013.01); *H01L 21/76897* (2013.01); *H01L 23/528* (2013.01); *H01L 23/535* (2013.01); *H01L 23/53228* (2013.01); *H01L 23/53257* (2013.01); *H01L 23/53295* (2013.01)

(56) References Cited

U.S. PATENT DOCUMENTS

| | | | | |
|---|---|---|---|---|
| 2015/0171091 A1* | 6/2015 | Lytle | ............. | H01L 29/665 257/369 |
| 2015/0235922 A1* | 8/2015 | Chen | ............. | H01L 23/481 257/383 |
| 2016/0172357 A1* | 6/2016 | Song | ............. | H01L 29/785 257/401 |
| 2017/0053863 A1* | 2/2017 | Lu | ............. | H01L 23/528 |

OTHER PUBLICATIONS

List of IBM Patents or Patent Applications Treated as Related; (Appendix P), Filed Aug. 31, 2016; 2 pages.

\* cited by examiner

US 10,388,602 B2

LOCAL INTERCONNECT STRUCTURE INCLUDING NON-ERODED CONTACT VIA TRENCHES

DOMESTIC PRIORITY

This application is a continuation of U.S. patent application Ser. No. 14/964,786, filed Dec. 10, 2015, the disclosure of which is incorporated by reference herein in its entirety.

BACKGROUND

The present invention relates generally to integrated circuits, and more specifically, to integrated circuit interconnect structures.

Integrated circuits (ICs) are typically fabricated from one or more layers of different materials. Some layers, such as polysilicon layers, are used to form semiconductor devices, while other layers, such as patterned metal layers, provide electrical connections between semiconductor devices. Referring to FIG. 1, a conventional intermediate interconnect structure 100 is illustrated following deposition of an optical planarization layer (OPL) 102. The intermediate interconnect structure 100 includes one or more dielectric layers 104 configured to isolate one or more metal contacts such as, for example, source/drain (S/D) metal contacts 106 and gate metal contacts 108. The OPL 102 is typically used as a masking layer to form one or more local metal layers (MO) (not shown).

Local contact vias are typically formed in the dielectric layer 104 so as to establish contact between the metal contacts 106/108 and a respective local metal layer (MO). For example, a first set of trenches 110 are formed through the dielectric layer 104 in preparation for forming a first set of local contact vias (CA) intended to contact the S/D metal contacts 106. Similarly, a second set of trenches 112 are formed through the dielectric layer 104 in preparation for forming a second set of local contact vias (CB) intended to contact the gate metal contacts 108. When filling the trenches 110/112 with the OPL 102, however, a portion of the OPL's upper surface 114 located above the contact trenches 110/112 is formed non-planar with respect to the remaining upper surface 114 of the OPL 102 due to the depth of the contact trenches 110/112. As shown in FIG. 1, for example, a portion of the OPL upper surface located above the trenches 110/112 may become concaved thereby forming a crater region 116 in the OPL 102. Thus, the crater region 116 region may have a first height (H1) that is below a second height (H2) of the remaining OPL upper surface 114.

A photoresist layer 118 is typically deposited on the OPL upper surface 114 and patterned in preparation for forming the local metal layers (MO) (See FIG. 2). However, the crater regions 116 cause over-etched corners 120 in the MO pattern 122. Following the removal of the OPL layer 102, the over-etched corners 120 cause the formation of eroded CA and/or CB contact trenches 124, i.e., contact trenches where the corners 126 are not ninety degrees (see FIG. 3). The eroded contact trenches 124 can lead to electrical shorting (i.e., short-circuit paths) between the subsequent local metal layer MO (i.e., the metal layer formed after filling the MO patterns) and any underlying contact levels.

SUMMARY

According to a non-limiting embodiment, a local interconnect structure includes a substrate having a dielectric layer and at least one semiconductor contact structure embedded in the dielectric layer. An electrically conductive material is deposited in a non-eroded contact trench that defines at least one electrically conductive contact via. The contact via extends from a first end that is flush with an upper surface of the dielectric layer to a second end that contacts the at one semiconductor contact structure. A local conductive material layer is formed in the dielectric layer and contacts the first end of the contact via. The non-eroded contact trench includes sharp upper corners formed at approximately ninety degrees with respect to the first end of the contact via.

According to another non-limiting embodiment, a method of forming a local interconnect structure comprises forming a substrate including a dielectric layer and at least one semiconductor contact structure embedded in the dielectric layer. The method further includes forming at least one contact trench in the dielectric layer so as to expose the at least one semiconductor contact structure. The method further includes performing a split damascene process that includes forming in the dielectric layer a local conductive material layer independently from a first contact via so as to establish a conductive path between the at least one semiconductor contact structure and the local conductive material layer.

According to yet another non-limiting embodiment, a method of forming a local interconnect structure comprises forming a first contact trench in a dielectric layer so as to expose at least one source/drain contact structure and forming a second contact trench in the dielectric layer so as to expose at least one gate contact structure. The method further includes partially filling the first and second contact trenches with a first conductive material so as to contact the at least one source/drain contact structure and the at least one gate contact structure. The method further includes depositing a masking layer atop the dielectric layer so as to completely fill the first and second contact trenches and cover the first conductive material. The method further includes performing a selective etching process that stops on an upper surface of the first conductive material so as to form a local conductive material pattern in the dielectric layer. The method further includes filling the local conductive material pattern with a second conductive material so as to form a local conductive material layer that directly contacts the first conductive material.

Additional features are realized through the techniques of the present invention. Other embodiments are described in detail herein and are considered a part of the claimed invention. For a better understanding of the invention with the features, refer to the description and to the drawings.

DETAILED DESCRIPTION

Various embodiments of the present disclosure provide a local interconnect structure that excludes eroded contact trenches, i.e., excludes eroded S/D contact trenches (CA) and/or eroded gate contact trenches (CB) so as to improve overall structural characteristics. Reasons for excluding erosions from the contact trenches includes, for example, reducing the possibility of electrical short-circuit paths between the subsequent local conductive layer MO (e.g., a metal layer formed after filling the MO patterns) and any underlying contact levels such as, for example, an underlying polysilicon (PC) layer and/or underlying trench silicide (TS) layer.

In at least one embodiment, a method of fabricating an interconnect structure having non-eroded contact trenches (i.e., that excludes eroded contact trenches) includes partially filling the contact trenches with a conductive material such as metal, for example, prior to depositing a masking layer use to form one or more local conductive layer (MO) patterns. By partially filling the contact trenches with the conductive material, the depth at which the OPL fills the contact trenches is reduced, which maintains the uniformity of the OPL upper surface and eliminates eroded contact trenches from the completed local interconnect structure.

Figure 1:
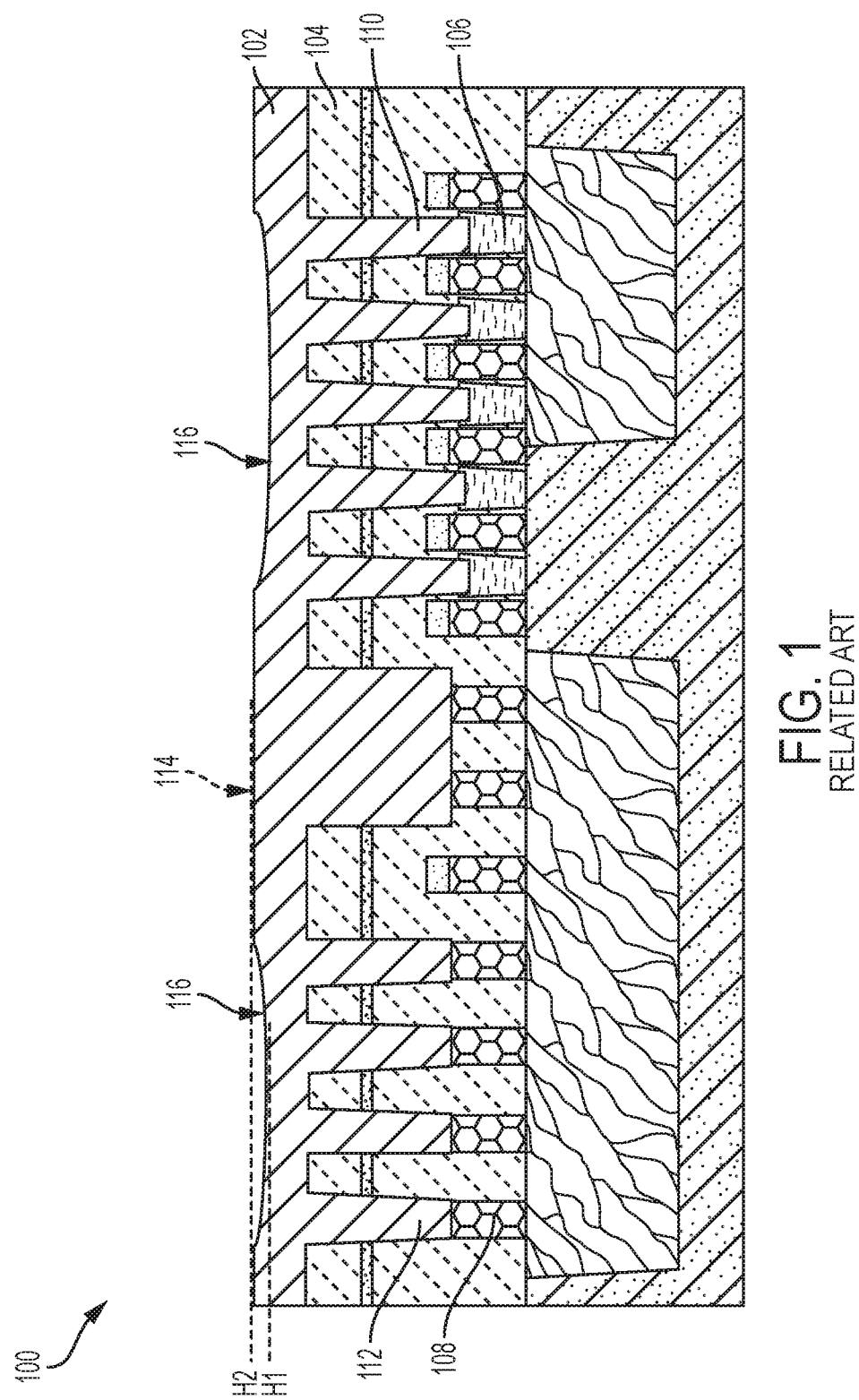
FIG. 1 illustrates a conventional intermediate interconnect structure following deposition of an OPL layer that fills contact via trenches.
Figure 2:
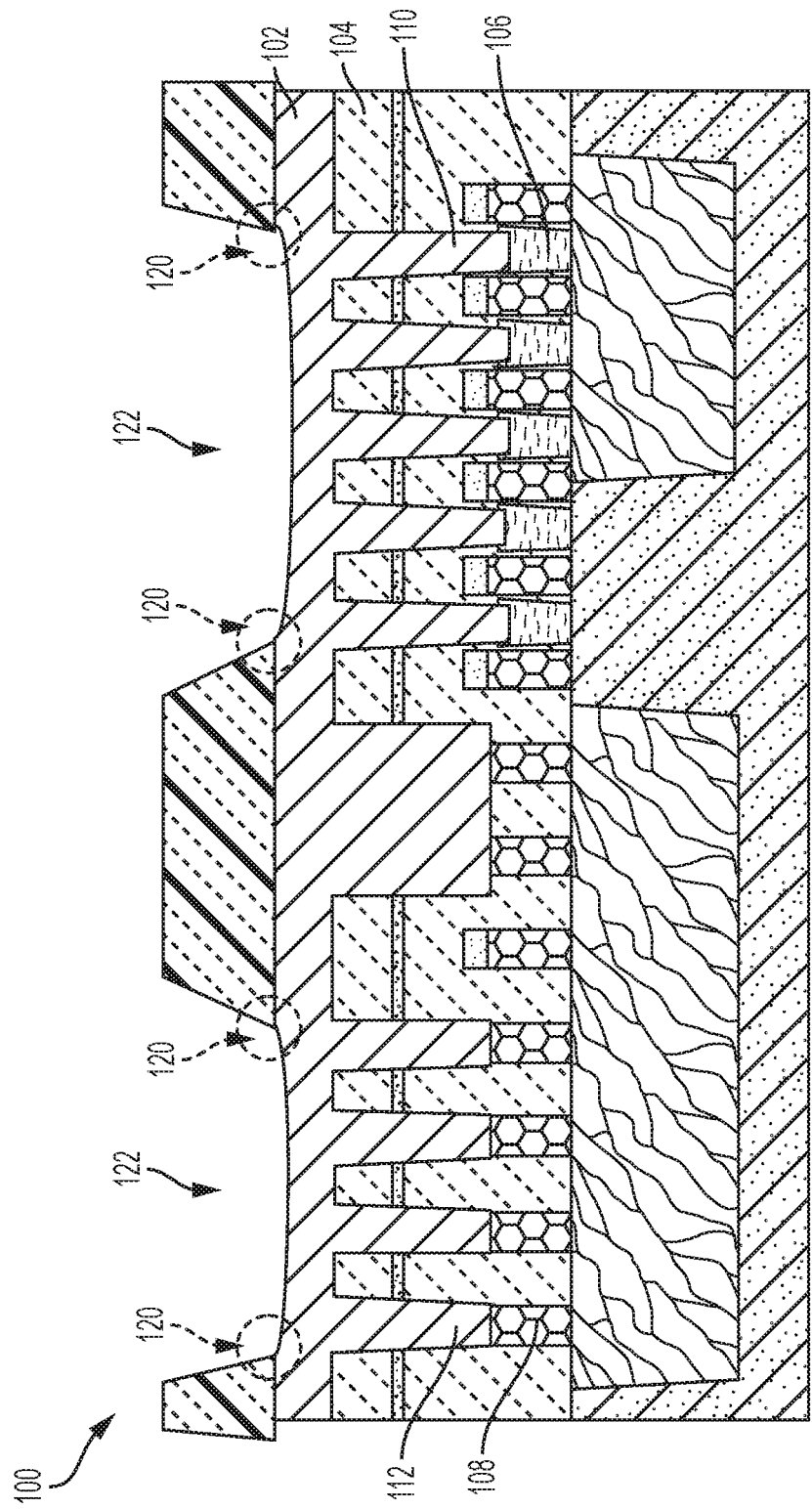
FIG. 2 illustrates the conventional intermediate interconnect structure of FIG. 1 following deposition and patterning of a photoresist layer deposited on an upper surface of the OPL layer.
Figure 3:
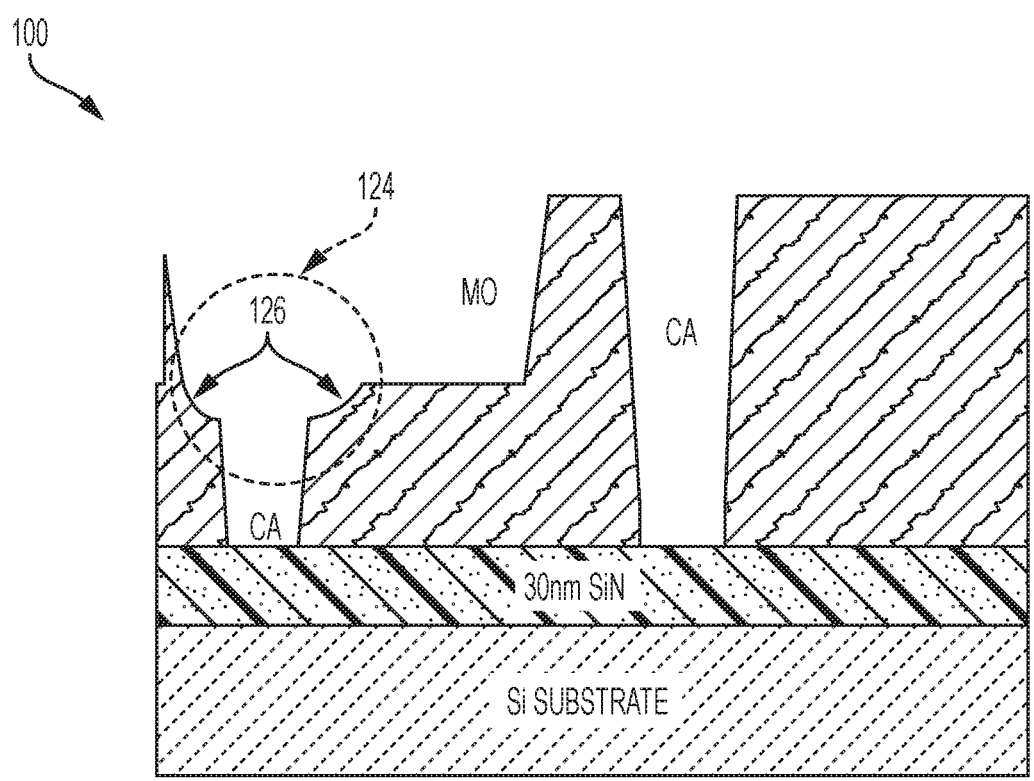
FIG. 3 illustrates an eroded contact trench included in the conventional intermediate interconnect structure shown in FIGS. 1-2 following removal of the OPL layer.
Figure 4:
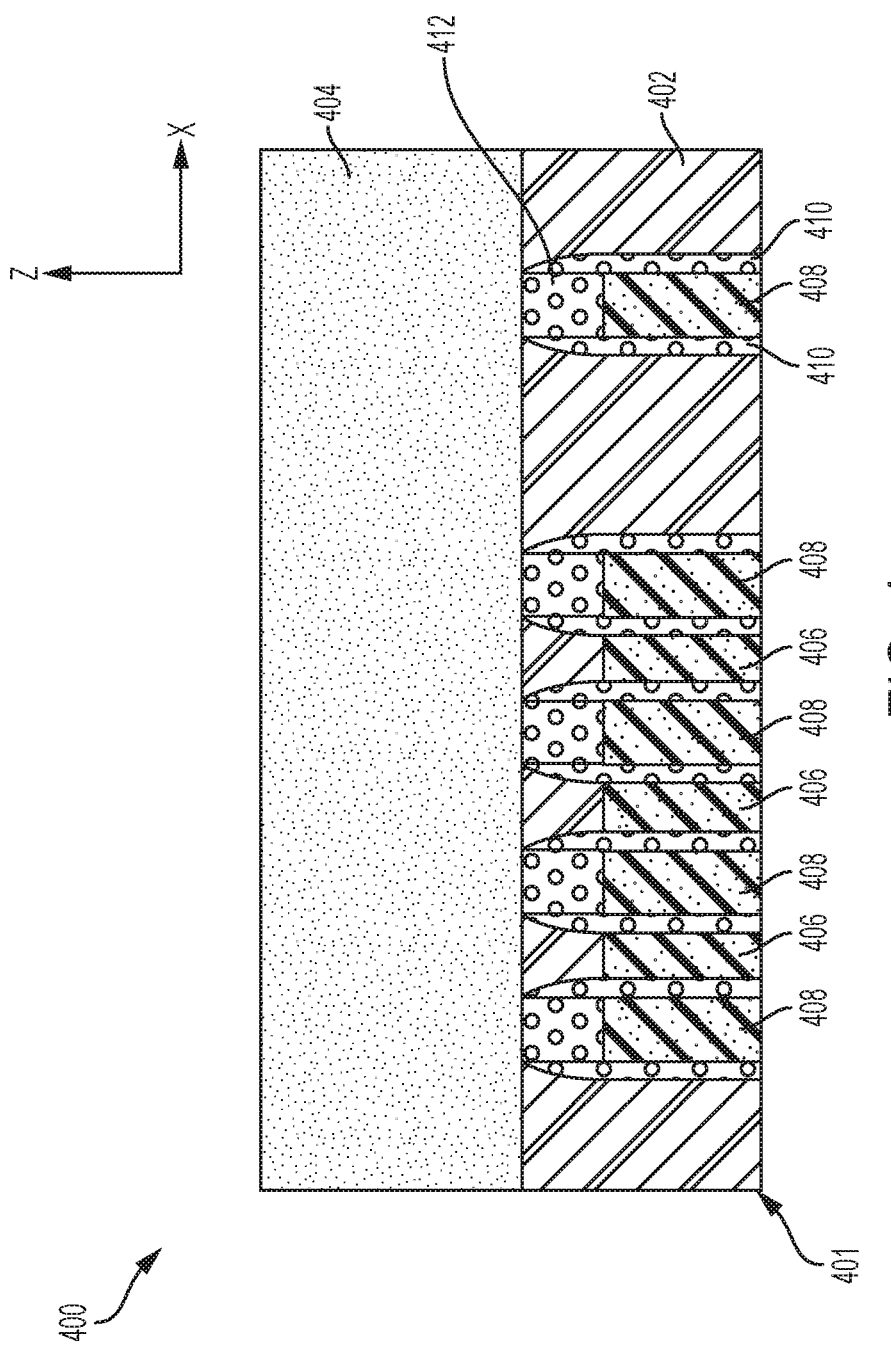
FIG. 4 illustrates an intermediate interconnect structure including dielectric layers containing a plurality of gate contact structures and a plurality of S/D contact structures according to a non-limiting embodiment.

With reference now to FIG. 4, an intermediate interconnect structure 400 is illustrated according to a non-limiting embodiment. In the present specification and claims, an "intermediate" interconnect structure is defined as an interconnect structure in a stage of fabrication prior to a final stage. The interconnect structure 400 includes a substrate 401 that extends along a first axis (e.g., X-axis) to define a length and a second axis (e.g., Z-axis) to define a height or vertical thickness. The substrate 401 includes one or more dielectric layers 402-404 containing one or more source/drain (S/D) contact structures 406 and one or more gate contact structures 408 according to a non-limiting embodiment. In at least one embodiment, a first dielectric layer 402 serves as an inter-layer dielectric (ILD) that contains the S/D contact structures 406 and the gate contact structures 408. The second dielectric layer 404 is stacked atop the first dielectric layer 402, and serves to support various interconnect structure (e.g., CA/CB contact vias and/or MO layers) as discussed in greater detail below. The first and second dielectric layers 402 and 404 may be formed from various dielectric materials including, but not limited to, silicon dioxide ($SiO_2$).

The S/D contact structures 406 and the gate contact structures 408 may be formed from various conductive materials including such as, for example, metal or silicide. The gate contact structures 408 may further include opposing gate spacers 410 and a gate cap 412 which serve to electrically isolate the gate contact structures 408 from the neighboring S/D contact structures 406. The gate spacers 410 and gate cap 412 may be formed from various spacer materials including, for example, silicon nitride (SiN).

According to at least one non-limiting embodiment, the first dielectric layer 402 has a vertical thickness extending along the Z-axis ranging from approximately 20 nanometers to approximately 200 nanometers, the second dielectric layer 404 has a vertical thickness of approximately 20 nanometers to approximately 200 nanometers, and the S/D and gate contact structures 406/408 have a vertical height extending along the Z-axis ranging from approximately 20 nanometers to approximately 150 nanometers.

Figure 5:
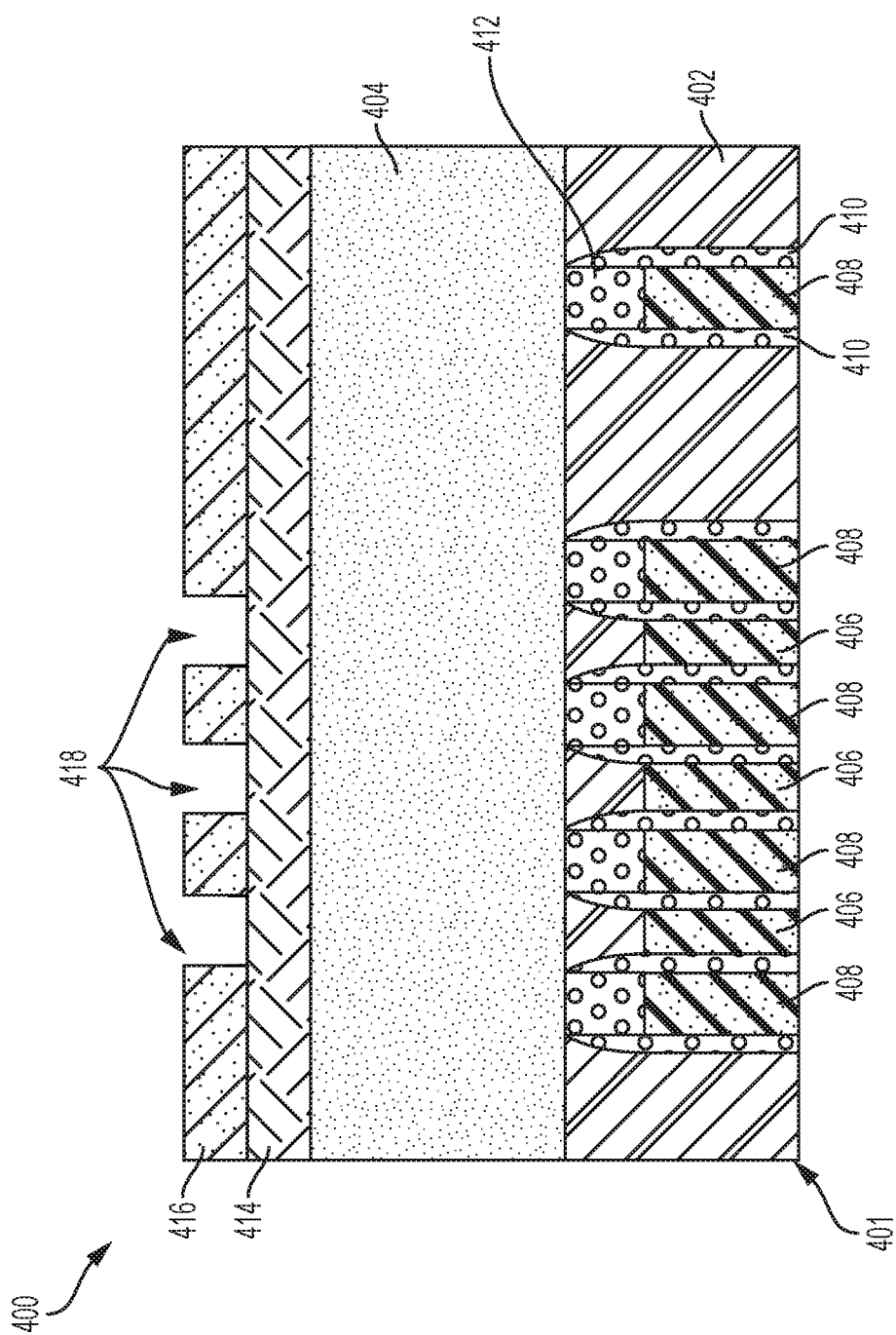
FIG. 5 illustrates the interconnect structure of FIG. 4 following a first patterning process to form a first contact pattern in a photoresist layer that is formed atop an OPL.

Referring to FIG. 5, the interconnect structure 400 is shown including an optical planarization layer (OPL) 414 interposed between the second dielectric layer 404 and a patterned photoresist layer 416. The OPL 414 serves as a masking layer and may be formed from various materials including, but not limited to, spin-on carbon (SOC), spin-on dielectric (SOD), spin-on metal hard mask (SO-MHM) materials. The vertical thickness of the OPL 414 ranges from approximately 30 nanometers to approximately 300 nanometers. The photoresist layer 416 may be formed from various photolithographic materials that are sensitive to light in order to facilitate a photolithography patterning process as understood by one of ordinary skill in the art. According to a first embodiment, a first patterning process is performed which forms first contact patterns 418 that expose a portion of the underlying OPL 414. In at least one embodiment, the first contact patterns 418 are aligned with each S/D contact structure 406 and will be referred hereinafter as CA contact patterns 418.

Figure 6:
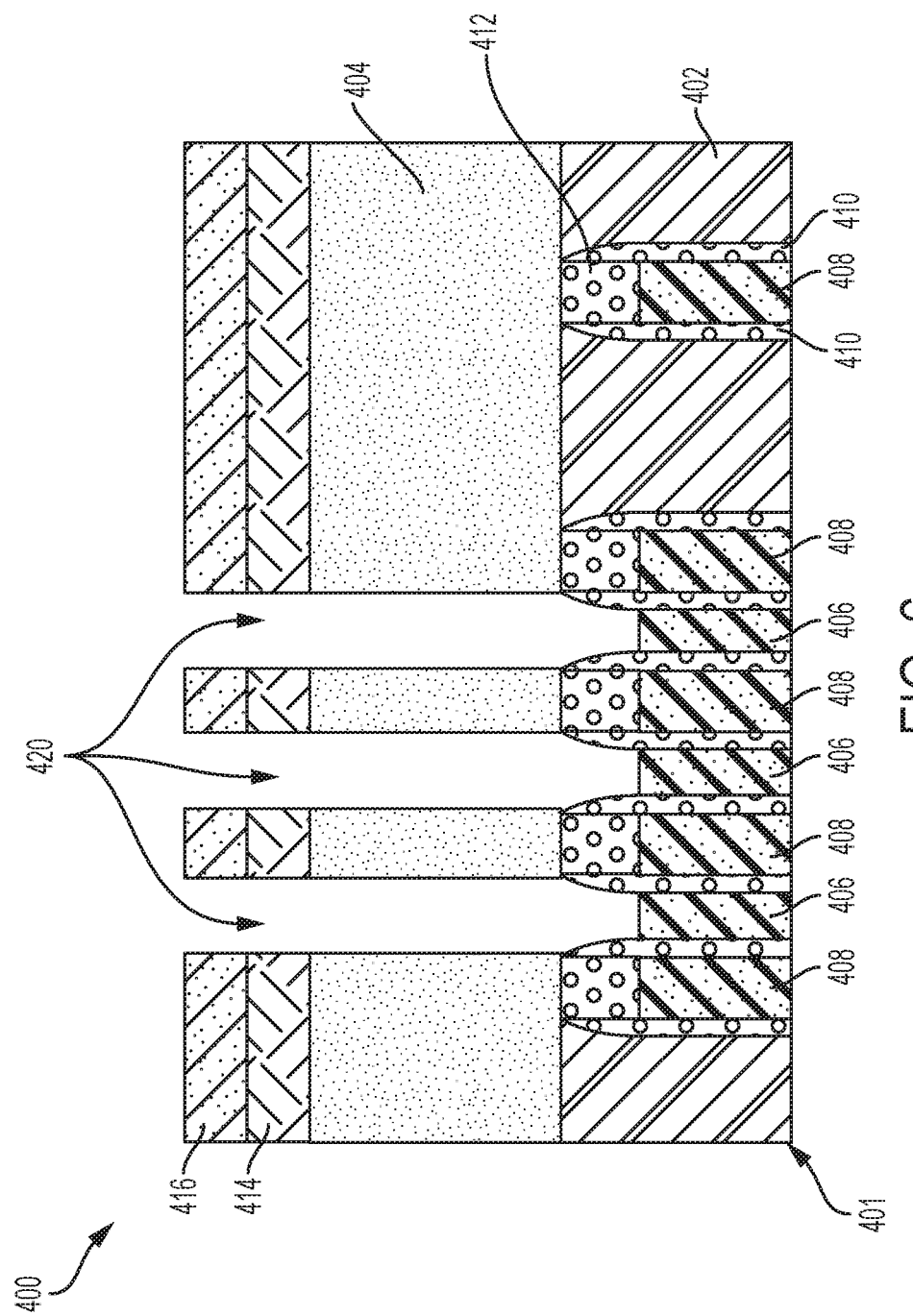
FIG. 6 illustrates the interconnect structure of FIG. 5 following a first etching process that transfers the first contact pattern into the dielectric layers so to form a first set of contact trenches that expose the S/D contact structures.

Turning to FIG. 6, the interconnect structure 400 is illustrated following a first etching process that transfers the CA contact patterns 418 into the first and second dielectric layers 402/404. The first etching process includes, for example, a selective reactive ion etch (RIE) capable of stopping on the upper surface of the S/D contact structures 406. In this manner, CA contact trenches 420 are formed and extend completely through the first and second dielectric layers 402-404.

Figure 7:
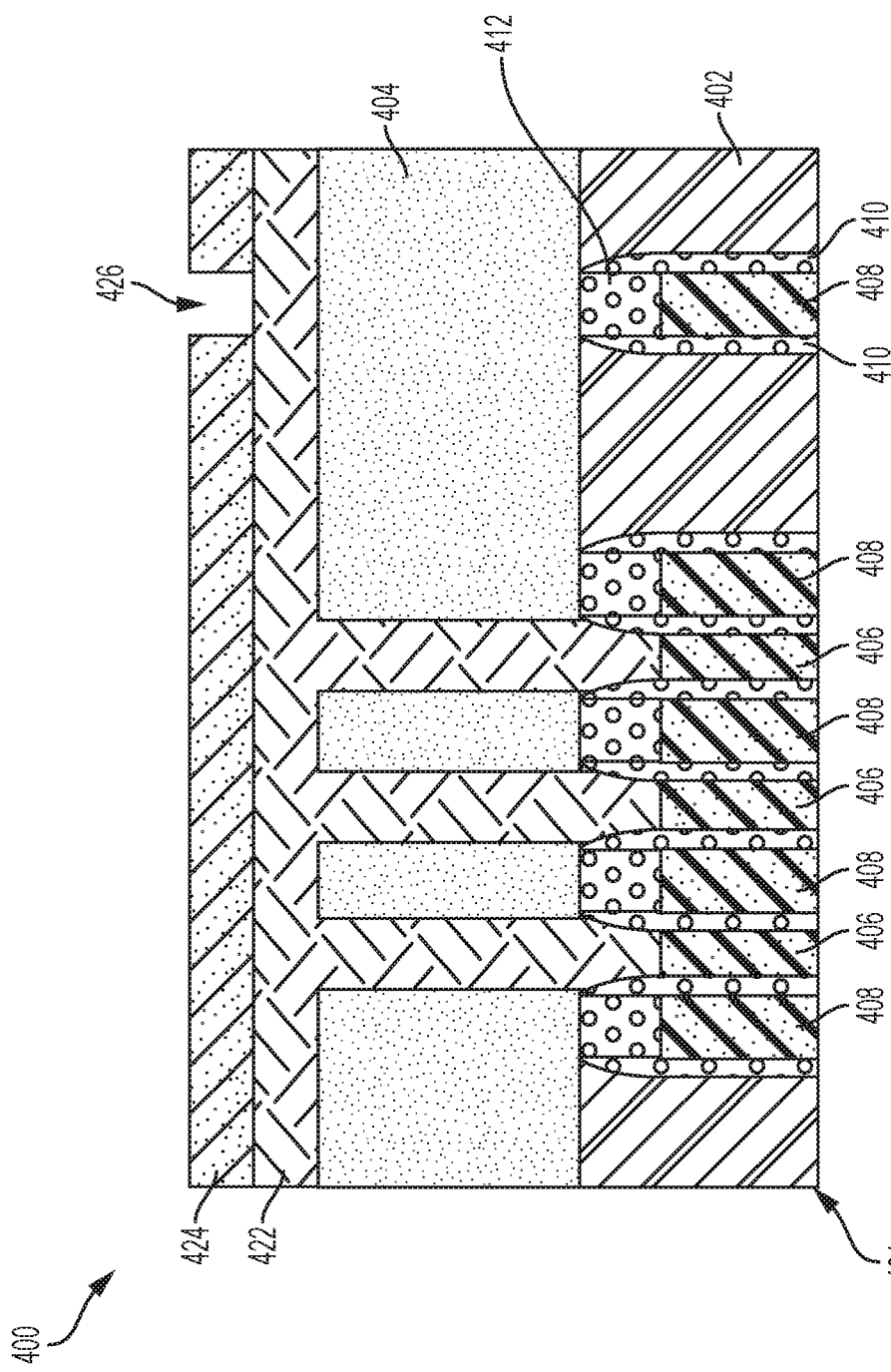
FIG. 7 illustrates the interconnect structure of FIG. 6 after forming a second OPL layer atop the interconnect structure that fills the first set of contact trenches, and following a second patterning process to form a second contact pattern in a second photoresist layer that is formed atop the second OPL.

Referring to FIG. 7, remaining portions of the initial OPL 414 and initial photoresist layer 416 are removed from the interconnect structure 400, and a new OPL 422 (second OPL 422) is deposited on the upper surface of the second dielectric layer 404 so as to completely fill the CA contact trenches 420. Similar to the initial OPL 414, the second OPL 422 may have a vertical thickness ranging from approximately 50 nanometers to approximately 200 nanometers. Thereafter, a new photoresist layer 424 (i.e., second photoresist layer 424) is deposited on an upper surface of the second OPL 422, and is patterned according to a photolithography process. Accordingly, a second contact pattern 426 (i.e., a CB contact pattern 426) is formed which exposes a portion of the underlying second OPL 422. In at least one embodiment, the CB contact pattern 426 is aligned with a respective gate contact structure 408 embedded within the first dielectric layer 402.

Figure 8:
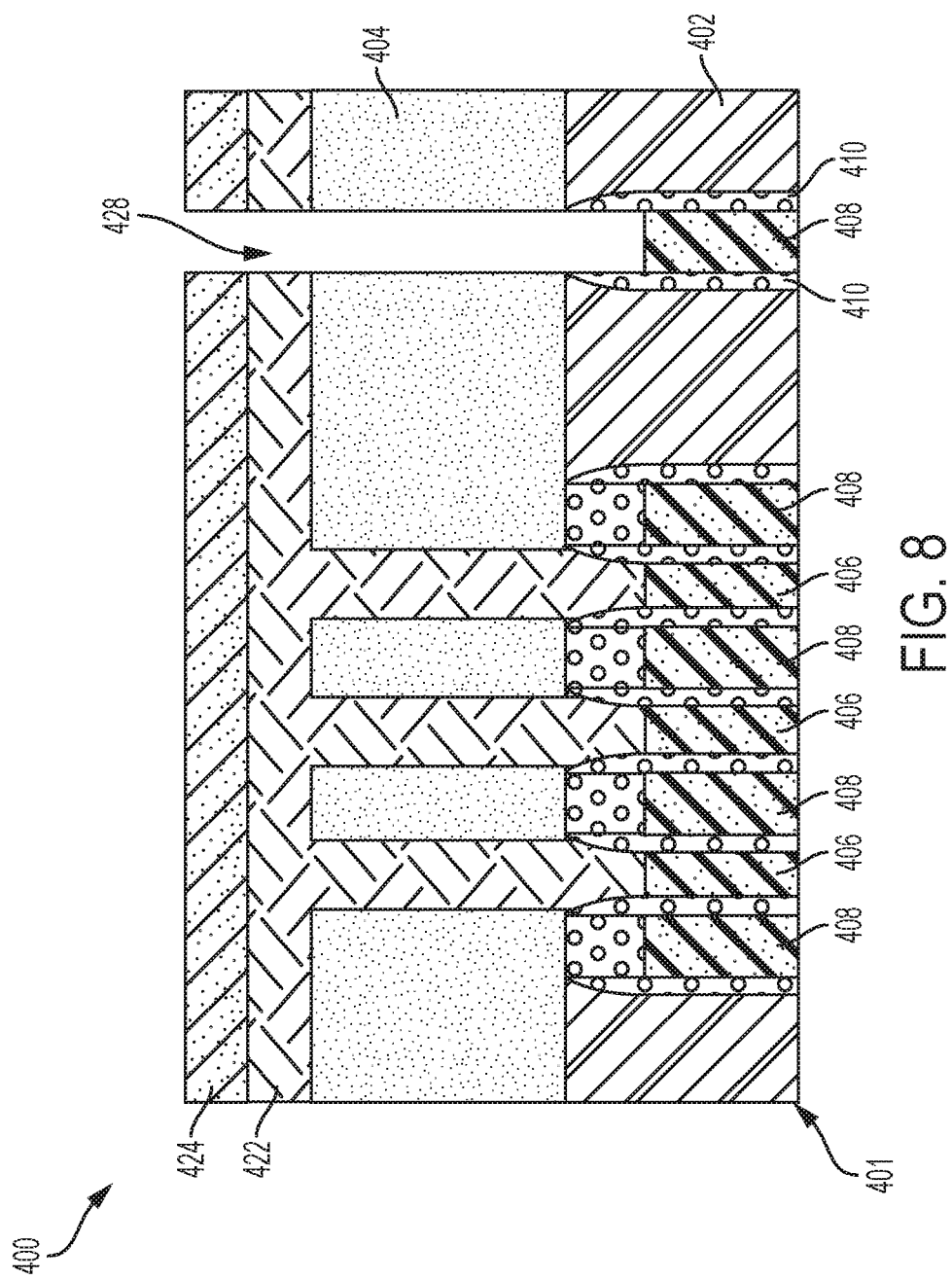
FIG. 8 illustrates the interconnect structure of FIG. 7 following a second etching process that transfers the second contact pattern into the dielectric layers so to form a second contact trench that exposes a respective gate contact structure.

Turning to FIG. 8, a second etching process is performed which transfers the CB contact pattern 426 into the first and second dielectric layers 402/404. In at least one embodiment, the second etching process includes a select RIE process that stops on an upper surface of the gate contact structure 408, i.e., the conductive material of the gate contact structure 408. In this manner, a CB contact trench 428 corresponding to the respective gate contact structure is formed through the OPL 422, the second dielectric layer 404, and the first dielectric layer 402. Although one CB contact trench 428 is illustrated, it should be appreciated that any number of CB contact trenches 428 corresponding to a respective gate contact structure 408 can be formed without departing from the scope of the invention.

Figure 9:
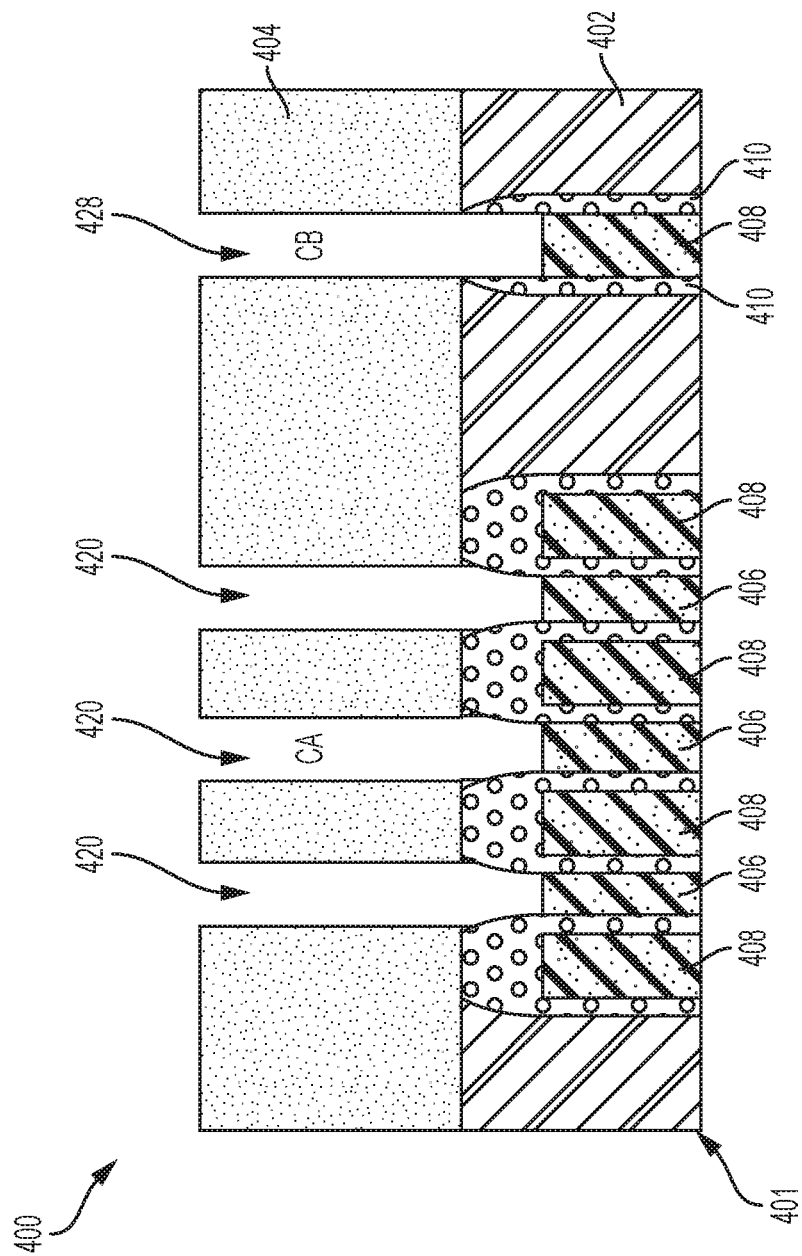
FIG. 9 illustrates the interconnect structure of FIG. 8 following removal of the second OPL and the second photoresist layer.

Referring to FIG. 9, the second photoresist layer 424 and the second OPL 422 are stripped away from the upper surface of the second dielectric layer 404 and from within the CB contact trench 428. Accordingly, the CA contact trenches 420 and the CB contact trench 428 are re-opened thereby re-exposing the underlying S/D contact structures 406 and the gate contact structure 408, respectively.

Figure 10:
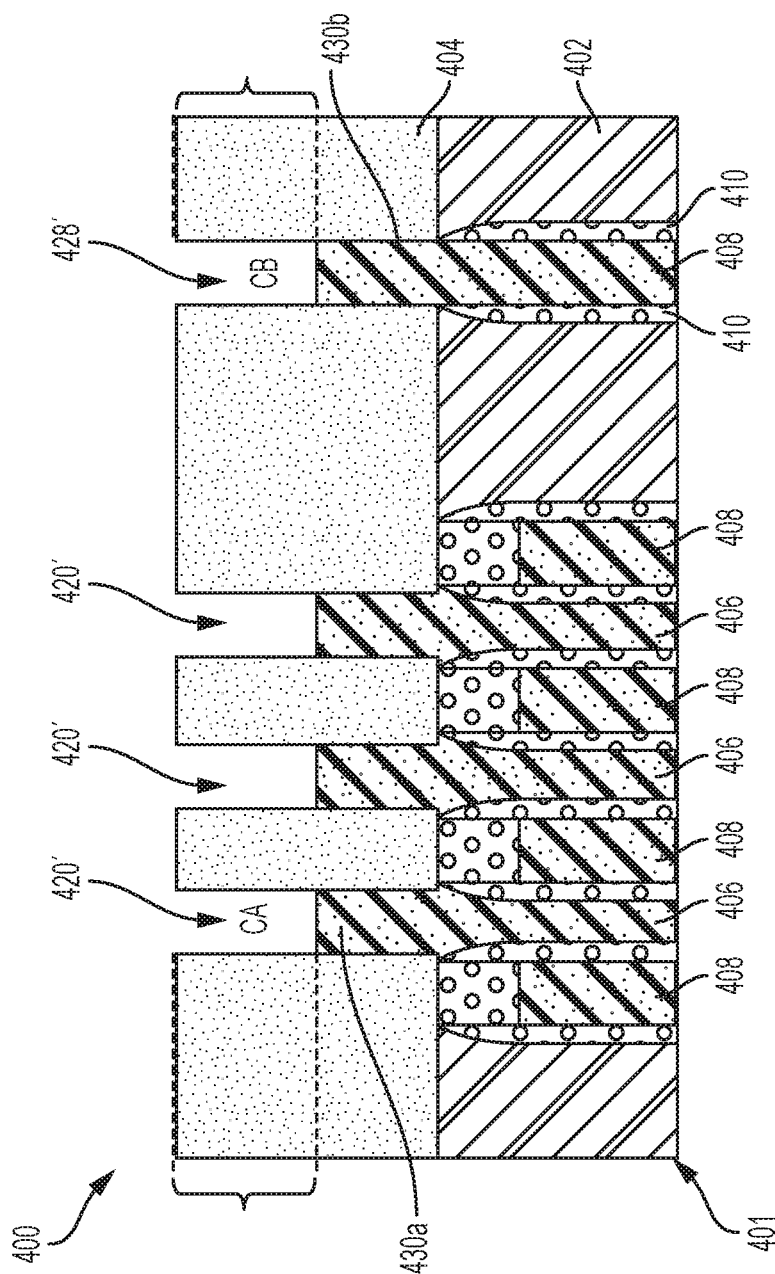
FIG. 10 illustrates the interconnect structure of FIG. 9 after partially filling the first and second contact trenches with a first conductive material.

Turning now to FIG. 10, the CA contact trenches 420 and the CB contact trench 428 are partially filled with a conductive trench material 430a-430b. In this manner, CA contact vias 430a and CB contact vias 430b are formed, while the depth of the contact trenches 420/428 is reduced so as to form reduced CA contact trenches 420' and a reduced CB contact trench 428'. The depth of the reduced CA contact trenches 420' and the reduced CB contact trench 428' ranges from approximately 20 nanometers to approximately 100 nanometers. According to at least one embodiment, the first conductive material is deposited such that a filled volume of the contact trenches 420/428 containing the first conductive material 430a-430b exceeds a remaining empty volume of the reduced contact trenches 420'/428'.

Various processes may be performed to partially fill the contact trenches 420/428. In one embodiment, a selective conductive material growth process is performed which selectively grows a conductive metal from the upper surface of the S/D contact structures 406 and the gate contact structure 408. In at least one embodiment, a bottom-up conductive material fill process is performed which fills the contact trenches 420/428 until reaching a desired height so as to form the reduced contact trenches 420'/428'. In another embodiment, an electroplating process is performed that continuously plates layers of conductive material within the contact trenches 420/428. Thereafter, a chemical mechanical planarization (CMP) process may be performed to planarize the plated conductive material flush with the upper surface of the second dielectric layer 404. A dry or wet etch process may then be performed to recess the plated conductive material to a desired depth so as to form the reduced contact trenches 420'/428'. In a similar manner, a chemical vapor deposition (CVD) may be used to fill the contract trenches 420/428, and thereafter followed by CMP process and etching process to attain the desired depth of the contact trench material. In each of the processes described above, the conductive material may include a metal material. The conductive material used to file the contact trenches 420/428 may also match the conductive material of the S/D contact structure and the gate contact structure 406/408.

Figure 11:
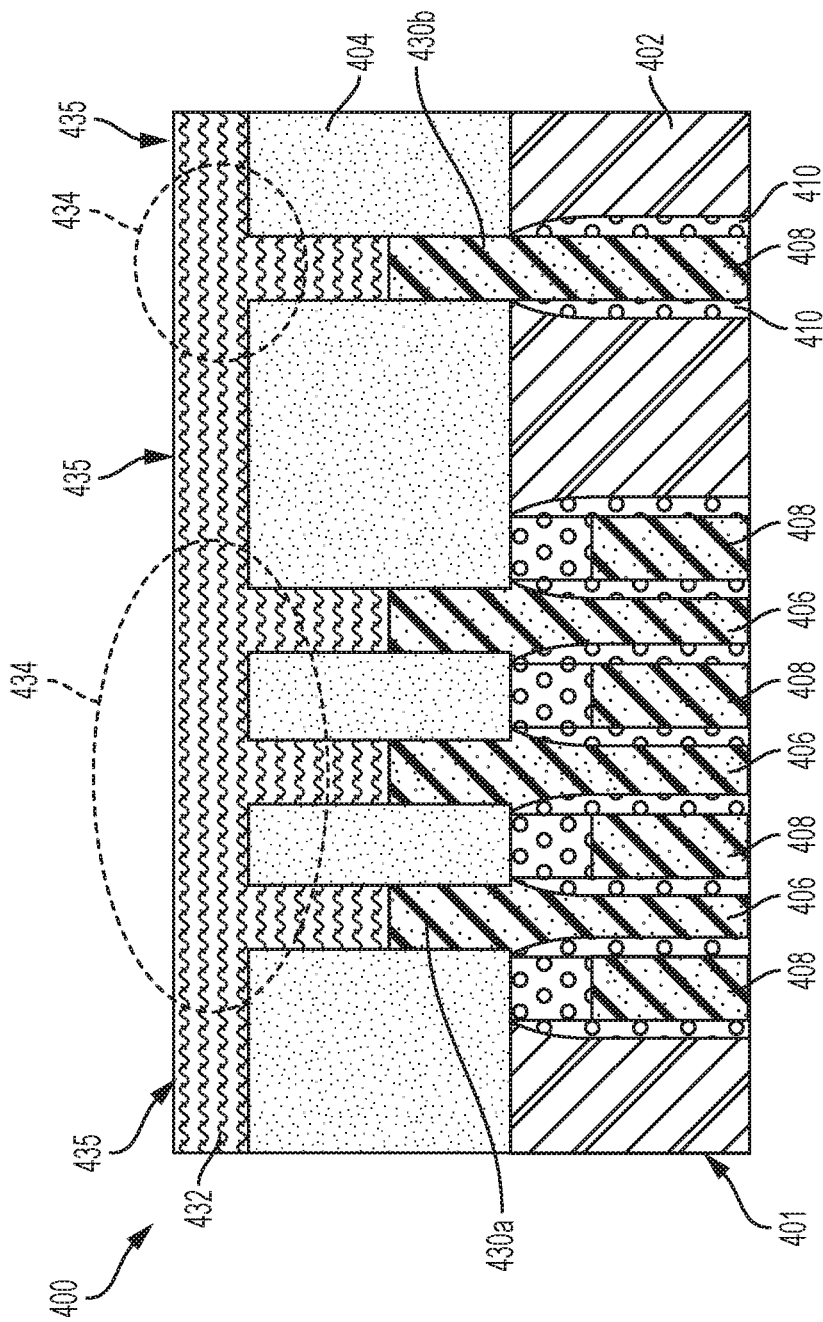
FIG. 11 illustrates the interconnect structure of FIG. 10 following deposition of a third OPL layer that completely fills the first and second contact trenches so as to cover the first conductive material.

Referring now to FIG. 11, a third OPL 432 (i.e., masking layer 432) is deposited on an upper surface of the second dielectric layer 404. The third OPL 432 completely fills the reduced CA contact trenches 420' and the reduced CB contact trench 428' so as to fully cover the CA contact vias 430a and the CB contact via 430b. The third OPL 432 has a vertical thickness ranging from approximately 50 nanometers to approximately 150 nanometers. Unlike conventional interconnect fabrication processes that utilize a damascene process to simultaneously form the CA/CB contact vias and the local conductive layer (MO), the depth of the third OPL 432 which fills the reduced contact trenches 420'/428' is reduced. Accordingly, portions 434 (hereinafter referred to OPL trench portions 434) of the third OPL 432 formed above the reduced contact trenches 420'/428' are substantially uniform with respect to the remaining portions 435 of the third OPL 432. That is, unlike conventional interconnect fabrication processes, at least one embodiment forms a third OPL 432 having a substantially uniform upper surface due to the increased support provided by the underlying CA/CB contact vias 430a-430b.

Figure 12:
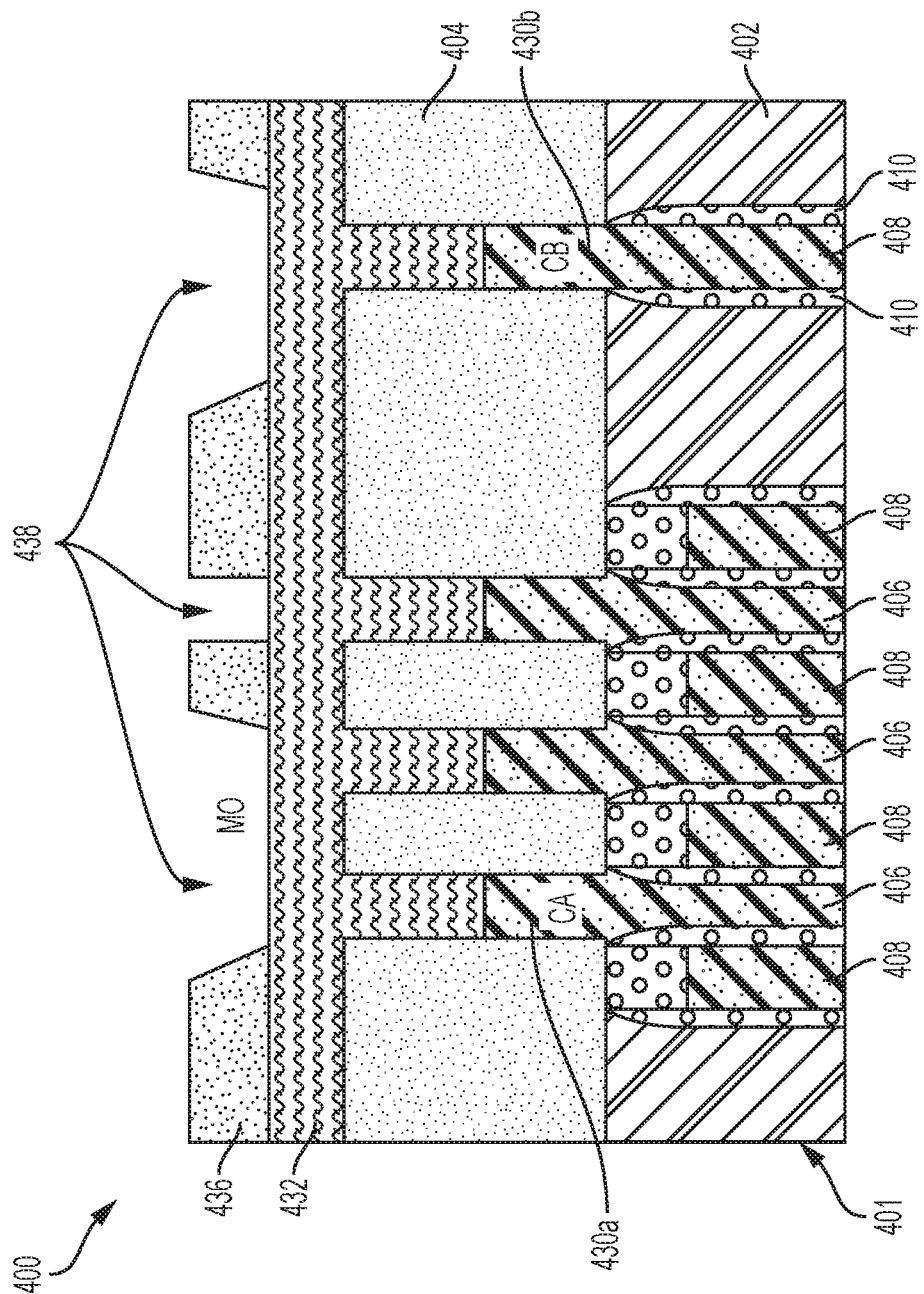
FIG. 12 illustrates the interconnect structure of FIG. 11 following a third patterning process to form a one or more local conductive patterns in a third photoresist layer that is formed atop the third OPL.

Referring to FIG. 12, a third photoresist layer 436 is deposited on the uniform upper surface of the third OPL 432, and is subsequently patterned to form one or more local conductive layer patterns 438 therein. The local conductive layer patterns 438 are subsequently utilized to perform a split damascene process that forms a local conductive layer in the second dielectric layer 404 independently from the CA/CB contact vias 430a-430b, as discussed in greater detail below. That is the damascene process is essentially split into a first process that first forms the CA/CB contact vias 430a-430b and a second process that subsequently forms the local MO layer. In at least one embodiment, each local conductive layer pattern 438 is aligned with the CA contact vias 430a or CB contact vias 430b. In this manner, the split damascene process utilizes the CA contact vias 430a and CB contact via 430b as an etch stop layer when transferring the local conductive layer patterns 438 into the second dielectric layer 404.

Figure 13:
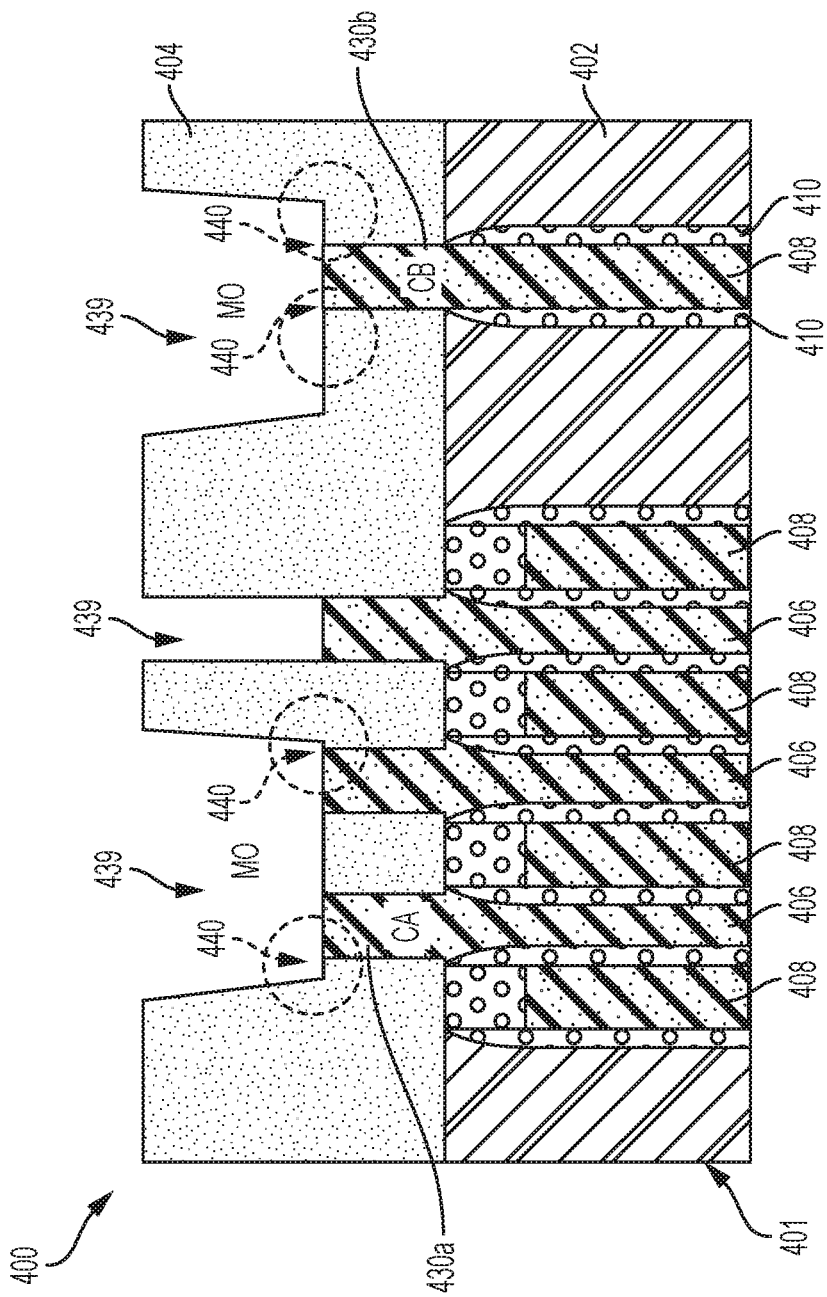
FIG. 13 illustrates the interconnect structure of FIG. 12 following a second etching process that transfers the local conductive patterns into the dielectric layers and stops on an upper surface of the conductive material.

Turning to FIG. 13, the interconnect structure 400 is illustrated following a third etching process that transfers the local conductive layer patterns 438 into the second dielectric layer 404 to form local MO trenches 439. In at least one embodiment, the third etching process is a selective RIE process which stops on the upper surface of the CA contact vias 430a and the CB contact via 430b. As further illustrated in FIG. 13, the upper surface of the CA contact vias 430a and the CB contact via 430b are formed flush with the base of the local MO trenches 439 formed in the second dielectric layer 404. That is, junction regions located at the corners 440 of the conductive trench material 430 are prevented from becoming eroded. Instead, sharp corners 440 are formed having an angle of approximately ninety degrees with respect to the contact vias 430a-0430b. Therefore, unlike conventional interconnect structures, at least one embodiment provides an interconnect structure 400 having non-eroded CA and CB contact trenches surrounding the CA contact vias 430a and the CB contact vias 430b. Accordingly, electrical shorting between the subsequent local conductive MO layers and any underlying contact levels may be eliminated.

Figure 14A:
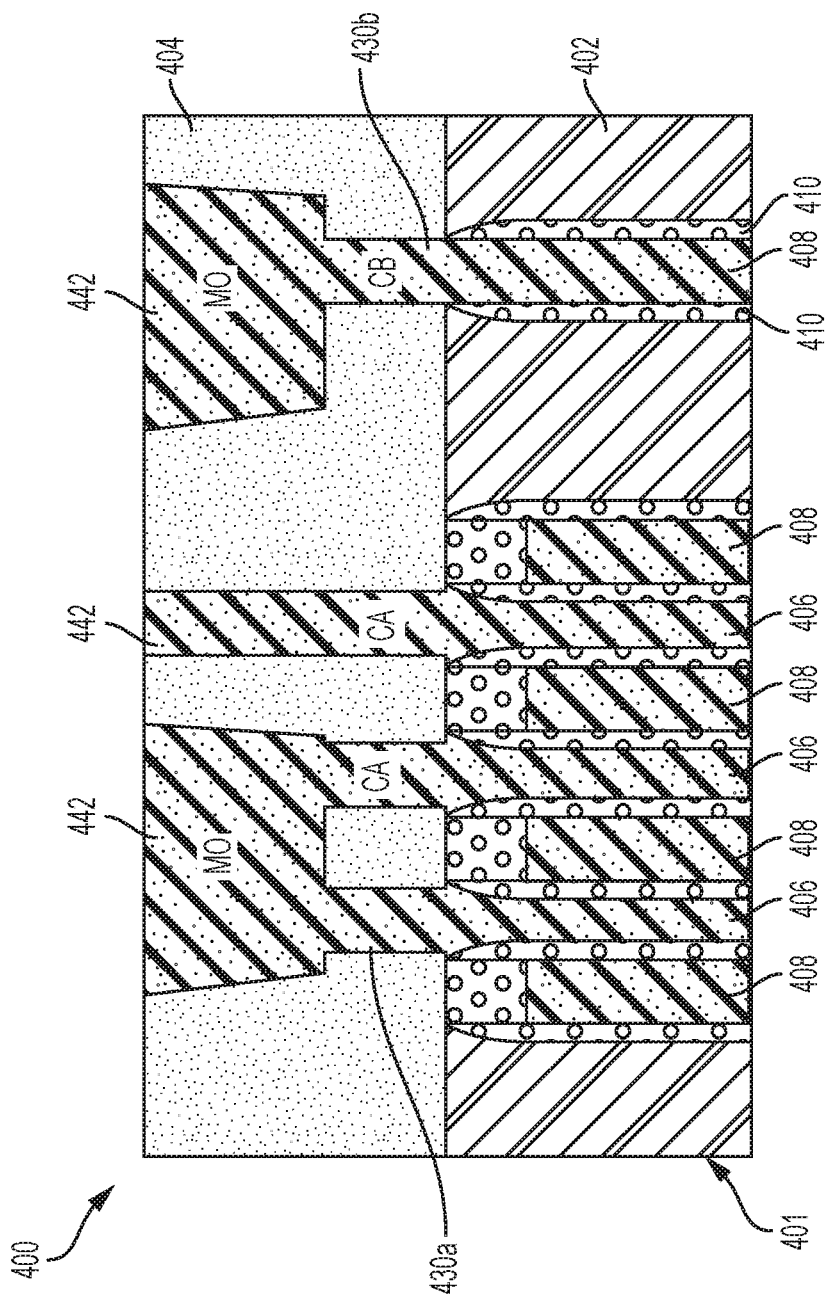
FIG. 14A illustrates the interconnect structure of FIG. 13 after removing the third OPL and third photoresist following deposition of a second conductive material that fills the local conductive patterns so as to form a local interconnect structure according to a non-limiting embodiment.

Turning now to FIG. 14A, the local MO trenches 439 are filled with a second conductive material so as to form a local conductive layer 442. In at least one embodiment, the second conductive material is metal which deposited using various types of metallization processes. For example, the local MO trenches 439 may be filled with a metal material 442 using a chemical vapor deposition (CVD) or an electroplating process which is then followed by a chemical mechanical planarization (CMP) process that stops on an upper surface of the second dielectric layer 404. Accordingly, a local metal (MO) layer 442 is formed which contacts the upper surface of the CA contact vias 430a and the CB contact via 430b. Accordingly, an electrically conductive path is established between the contact structures 406-408 and a respective local MO layer 442. In at least one embodiment further illustrated in FIG. 14A, the type of metal used to form the local MO layer 442 matches the metal of the CA contact vias 430a and CB contact via 430b. For example, the local MO layer 442 and the CA/CB contact trenches 430a-430b may both be formed from tungsten (W) or copper (Cu).

Figure 14B:
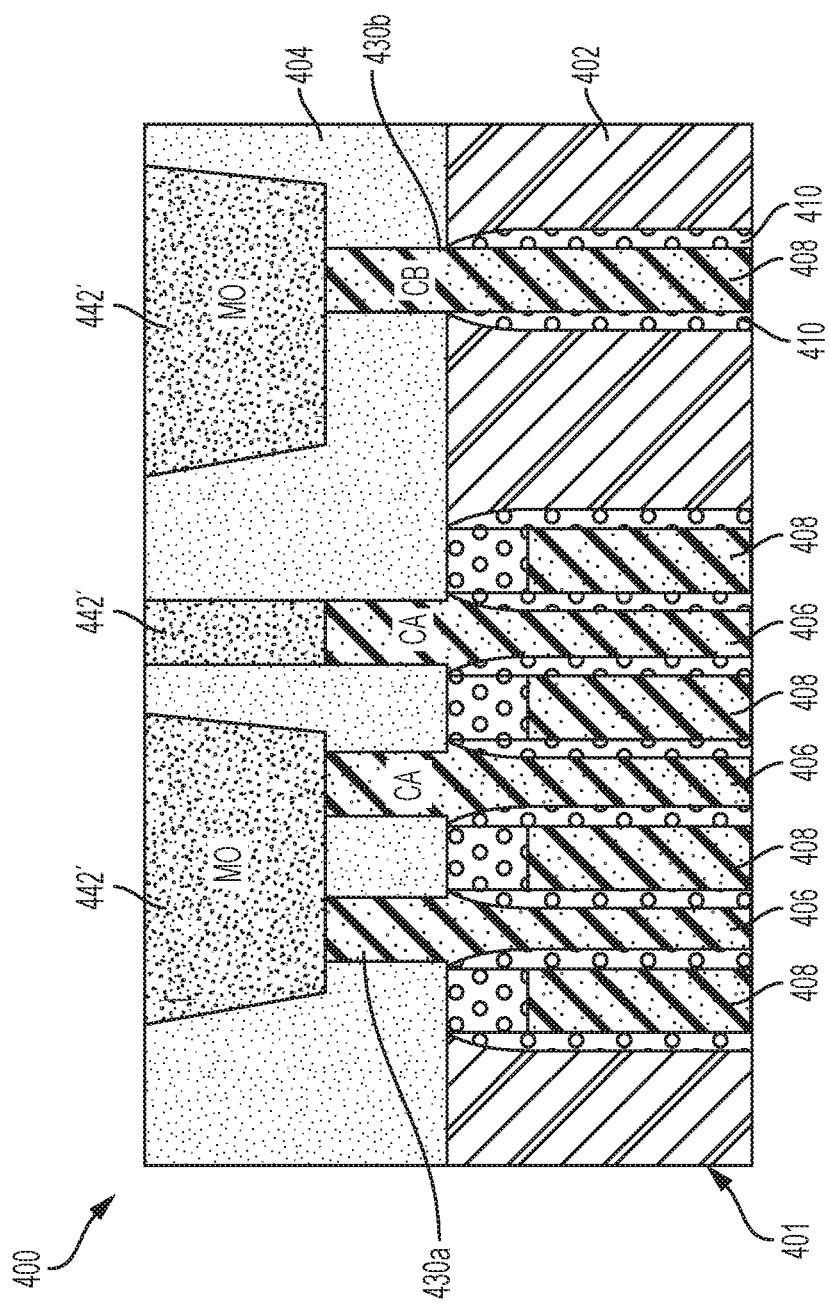
FIG. 14B illustrates the interconnect structure of FIG. 13 following deposition of a third conductive material that fills the local conductive patterns so as to form a local interconnect structure according to another non-limiting embodiment.

FIG. 14B illustrates the interconnect structure of FIG. 13 following deposition of a conductive material in the local MO trenches 439 to form to form a local MO layer 442'. In this embodiment, however, the conductive material of the local MO layer 442' is different from the material of the contact vias 430a-430b. For example, the local MO layer 442' can be formed from tungsten (W) while the CA/CB contact trenches 430a-430b can be formed from copper (Cu).

Accordingly, various embodiments described above provide a local interconnect structure that excludes eroded contact trenches, e.g., S/D contact trenches (CA) and/or gate contact trenches (CB) excluding eroded corners, thereby the improving structural characteristics of the overall local interconnect. The integrity of the CA/CB trenches are maintained by performing a split damascene process that prevents the CA/CB corners from eroding, i.e., maintains sharp corners having an angle that is substantially ninety degrees at the MO-CA interface and/or MO-CB interface. These sharp corners reduce the possibility of electrical short-circuit paths between the subsequent local conductive layer MO (e.g., a metal layer formed after filling the MO patterns) and any underlying contact levels such as, for example, an underlying polysilicon (PC) layer and/or underlying trench silicide (TS) layer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A local interconnect structure, comprising:
a substrate extending along a longitudinal direction to define a length and a vertical direction perpendicular to the longitudinal direction to define a height, the substrate including a first dielectric layer and at least one semiconductor contact structure embedded in the first dielectric layer, the at least one semiconductor contact structure extending along the longitudinal direction to define a contact thickness and along the vertical direction to define a contact height;
a second dielectric layer deposited on an upper surface of the first dielectric layer
an electrically conductive material deposited in a non-eroded contact trench that defines first and second electrically conductive contact vias, the first and second contact vias comprising a first metal and extending from a first end that is flush with an upper surface of the second dielectric layer to a second end that contacts the at one semiconductor contact structure;
a local conductive layer in the second dielectric layer that extends across both the first and second contact vias, and that contacts the first end of each of the first and second contact vias, the local conductive layer comprising a second metal different from the first metal, wherein a depth of the local conductive layer ranges from approximately 20 nanometers to approximately 100 nanometers; and
a gate contact structure embedded in the first dielectric layer, the gate contact structure extending along the longitudinal direction to define a gate thickness and along the vertical direction to define a gate height, wherein the contact height of the at least one semiconductor contact structure matches the gate height of the gate contact structure, the gate contact structure includes a first non-conductive spacer formed on a first sidewall of a gate contact and a second non-conductive spacer formed on a second sidewall of the gate contact and;

wherein the non-eroded contact trench includes sharp upper corners formed at approximately ninety degrees with respect to the first end of the first and second contact vias, and wherein the electrically conductive material extends along the longitudinal direction within the non-eroded contact trench to define a via thickness that is greater than the structure thickness of the at least one semiconductor contact structure, and wherein the electrically conductive material is directly on an upper surface of the at least one semiconductor contact structure to define a tapered portion between at least one electrically conductive via and the at least one semiconductor contact structure, wherein a first side wall of the at least one semiconductor contact structure directly contact at least one of the first and second spacers of the gate contact structure.

2. The local interconnect structure of claim 1, further comprising a second dielectric layer deposited on an upper surface of the first dielectric layer.

3. The local interconnect structure of claim 1, wherein the first metal is tungsten (W) and the second metal is copper (Cu).

4. The local interconnect structure of claim 1, wherein the at least one contact via and the local conductive layer both comprise the same metal.

5. The local interconnect structure of claim 1, wherein the local conductive layer extends along the longitudinal direction to define a contact length that is greater than the via thickness of the at least one contact via.

6. The local interconnect structure of claim 5, wherein the contact length of the local conductive layer is greater than the via thickness and the structure thickness.

7. The local interconnect structure of claim 6, wherein the at least one contact via includes first and second contact vias, and the local conductive layer is on an upper surface of the first and second adjacent contact vias.

8. The local interconnect structure of claim 7, wherein the first and second adjacent contact vias are separated by one another by the gate contact structure.

9. The local interconnect structure of claim 8, wherein the first spacer is interposed between the first adjacent contact via and the first sidewall of the gate contact structure and the second spacer is interposed between the second adjacent contact via and the second sidewall of the gate contact structure.

10. The local interconnect structure of claim 9, wherein a portion of the second dielectric layer is on an upper surface of the gate contact so as to electrically isolate the gate contact from the local conductive layer.

11. The local interconnect structure of claim 10, wherein the gate contact comprises a metal material.

12. The local interconnect structure of claim 10, wherein the gate contact comprises a silicide material.

13. The local interconnect structure of claim 11, wherein the first and second dielectric layers comprise silicon dioxide ($SiO_2$), and the first and second spacers comprise silicon nitride (SiN).

* * * * *